United States Patent
Choi et al.

(10) Patent No.: US 7,777,220 B2
(45) Date of Patent: Aug. 17, 2010

(54) ORGANIC THIN FILM TRANSISTOR ARRAY PANEL

(75) Inventors: Tae-Young Choi, Seoul (KR); Soo-Wan Yoon, Suwon-si (KR); Bo-Kyoung Ahn, Incheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/148,485

(22) Filed: Apr. 17, 2008

(65) Prior Publication Data

US 2009/0026444 A1 Jan. 29, 2009

(30) Foreign Application Priority Data

Jul. 24, 2007 (KR) .................. 10-2007-0074017

(51) Int. Cl.
*H01L 51/52* (2006.01)

(52) U.S. Cl. .................. 257/40; 257/59; 257/72; 257/E51.001; 257/E51.003; 257/E51.005; 438/99

(58) Field of Classification Search .................. 257/40, 257/59, 72, E51.001, E51.003, E51.005; 438/99
See application file for complete search history.

(56) References Cited

U.S. PATENT DOCUMENTS

| | | | | |
|---|---|---|---|---|
| 5,414,283 | A | * | 5/1995 | den Boer et al. ............ 257/59 |
| 2002/0130324 | A1 | * | 9/2002 | Song et al. ............ 257/72 |
| 2004/0036072 | A1 | * | 2/2004 | Tsujimura et al. ............ 257/72 |
| 2004/0046164 | A1 | | 3/2004 | Kobayashi et al. |
| 2005/0145849 | A1 | | 7/2005 | Moon et al. |
| 2006/0081849 | A1 | * | 4/2006 | Lee et al. ............ 257/72 |
| 2007/0114524 | A1 | * | 5/2007 | Oh et al. ............ 257/40 |
| 2007/0262308 | A1 | * | 11/2007 | Song ............ 257/59 |

FOREIGN PATENT DOCUMENTS

| | | |
|---|---|---|
| JP | 8-160469 | 6/1996 |
| JP | 2006-154362 | 6/2006 |
| KR | 2005-0067803 | 7/2005 |

OTHER PUBLICATIONS

Patent Abstracts of Japan, Publication No. 08-160469, Jun. 21, 1996, 1 p.
Patent Abstracts of Japan, Publication No. 2006-154362, Jun. 15, 2006, 1 p.
Korean Patent Abstracts, Publication No. 1020050067803, Jul. 5, 2005, 1 p.

* cited by examiner

*Primary Examiner*—Lynne A Gurley
*Assistant Examiner*—Naima J Kearney
(74) *Attorney, Agent, or Firm*—Innovation Counsel LLP

(57) ABSTRACT

An organic thin film transistor array panel includes a substrate, a gate line formed on the substrate and including a gate electrode. A gate insulating layer is formed on the gate electrode and a data line is formed on the gate insulating layer, intersecting the gate line, and including a drain electrode. A source electrode is formed on the gate insulating layer and is spaced apart from the drain electrode, enclosed by the drain electrode. A bank insulating layer includes a first opening exposing the drain electrode and the source electrode and a second opening which exposes at least a portion of the source electrode. An organic semiconductor is formed in the first opening and contacts the drain electrode and the source electrode. A pixel electrode contacts the source electrode through the second opening.

14 Claims, 8 Drawing Sheets

ORGANIC THIN FILM TRANSISTOR ARRAY PANEL

CROSS-REFERENCE TO RELATED APPLICATION

This application claims priority to and the benefit of Korean Patent Application No. 10-2007-0074017 filed in the Korean Intellectual Property Office on Jul. 24, 2007, the entire contents of which are incorporated herein by reference.

BACKGROUND OF THE INVENTION (a) Field of the Invention

The present invention relates to an organic thin film transistor array panel and a method for manufacturing the same.

(b) Description of the Related Art

Recently, flat panel displays having advantages of a small size and light weight have provided advantageous display devices. Flat panel displays include a liquid crystal display (LCD), and an organic light emitting diode (OLED) display device, having a substrate in which thin film transistors are commonly provided. Among these thin film transistors, an organic thin film transistor (OTFT) including an organic semiconductor is being actively developed instead of an inorganic semiconductor such as silicon.

Here, the thin film transistor includes a gate electrode, a drain electrode and a source electrode divided from each other with respect to the gate electrode, and an organic semiconductor formed in the space between the drain electrode and the source electrode. Further, the space between the drain electrode and the source electrode is defined as a channel region, and the on-current value of the organic thin film transistor is increased as the width (W) of the channel region increases and the length of the channel region is reduced, thereby improving the characteristics of the organic thin film transistor.

However, if the width/the length of the channel region is maximized to increase on-current, the parasitic capacitance generated between the source electrode and the gate electrode is increased such that the characteristics of the organic thin film transistor are not improved.

The above information disclosed in this Background section is only for enhancement of understanding of the background of the invention and therefore it may contain information that does not form the prior art that is already known in this country to a person of ordinary skill in the art.

SUMMARY OF THE INVENTION

Accordingly, an advantage of the present invention is to improve the characteristics of the organic thin film transistor by maximizing the values of the width and the length of the channel region while preventing an increase in the parasitic generated between the source electrode and the gate electrode channel region.

An organic thin film transistor array panel according to an exemplary embodiment of the present invention includes a substrate; a gate line formed on the substrate and including a gate electrode; a gate insulating layer formed on the gate electrode; a data line formed on the gate insulating layer while intersecting the gate line, and including a drain electrode; a source electrode separated from the drain electrode and enclosed by the drain electrode; a bank insulating layer including a first opening exposing the drain electrode and the source electrode and a second opening enclosed by first opening; an organic semiconductor formed in the first opening and connected to the drain electrode and the source electrode; and a pixel electrode connected to the source electrode through the second opening.

The gate electrode may have a gate electrode hole.

The drain electrode may include an closed loop portion.

The closed loop portion may overlap a portion of the gate electrode or the whole gate electrode.

A passivation layer may be included on the organic semiconductor.

The drain electrode, source electrode, and pixel electrode may be made of one of ITO (indium tin oxide) and IZO (indium zinc oxide).

The organic semiconductor may be made of or from derivatives of tetracene or pentacene with a substituent.

The gate electrode hole may overlap the second opening of the bank insulating layer.

The data line and source electrode may be made of a lower layer including ITO and an upper layer including molybdenum, and the organic semiconductor may contact the lower layer of the source electrode and the drain electrode.

A method for manufacturing an organic thin film transistor array panel according to an exemplary embodiment of the present invention includes forming a gate electrode on a substrate, forming a gate insulating layer covering the gate electrode, forming a drain electrode and a source electrode on the gate insulating layer, forming a bank insulating layer on the drain electrode and the source electrode, forming a first opening in the bank insulating layer, forming an organic semiconductor in the first opening, forming a second opening exposing the source electrode in the bank insulating layer, and forming a pixel electrode connected to the source electrode through the second opening.

A passivation layer may be further included on the organic semiconductor.

The forming of the second opening exposing the source electrode in the bank insulating layer may be executed along with forming the second opening in the passivation layer after forming the passivation layer, such that the second opening may pass through the passivation layer and the bank insulating layer.

The gate electrode may include a gate electrode hole.

The organic semiconductor may be formed using an inkjet printing method.

The drain electrode, source electrode, and pixel electrode may include ITO or IZO.

The drain electrode and the source electrode may include a lower layer including ITO and an upper layer including molybdenum, and the upper layer that is exposed through the first opening may be removed between the forming of the first opening in the bank insulating layer and the forming of the organic semiconductor in the first opening.

DETAILED DESCRIPTION OF THE EMBODIMENTS

Figure 1:
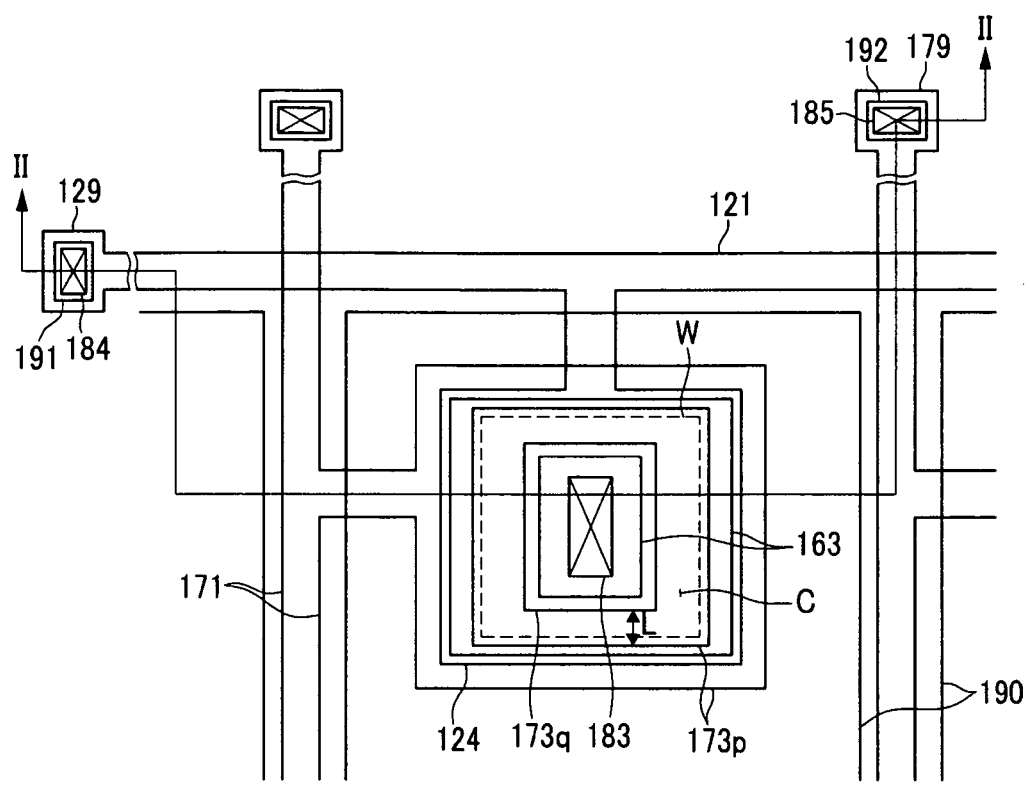
FIG. 1 is a layout view of an organic thin film transistor (OTFT) array panel according to a first exemplary embodiment of the present invention.

The present invention is described fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, and regions are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, an organic thin film transistor array panel according to an embodiment of the present invention will be described with reference to FIGS. 1 and 2.

Figure 2:
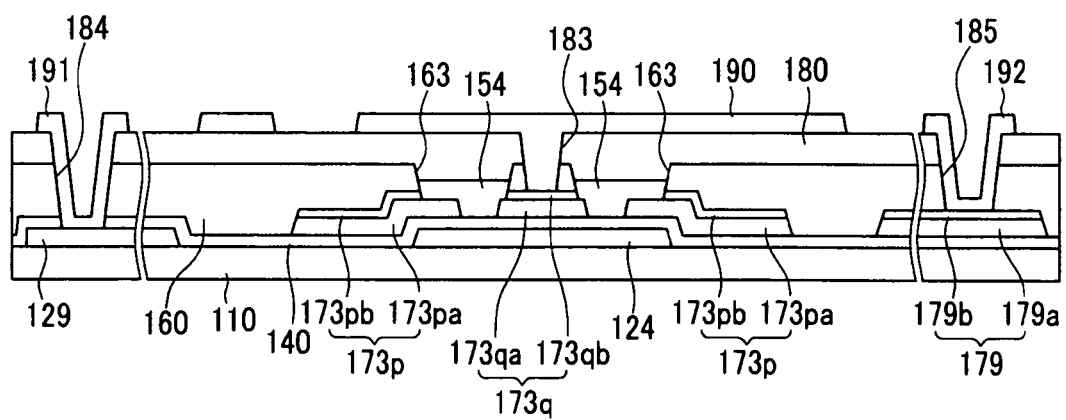
FIG. 2 is a cross-sectional view of the organic thin film transistor array panel shown in FIG. 1 taken along the line II-II.

FIG. 1 is a layout view of an organic thin film transistor array panel according to an embodiment of the present invention, and FIG. 2 is a sectional view of the organic thin film transistor array panel shown in FIG. 1 taken along the line II-II.

As shown in FIGS. 1 and 2, a plurality of gate lines 121 are formed on an insulating substrate 110 made of a material such as transparent glass, silicone, or plastic.

The gate lines 121 transmit gate signals and extend substantially in a transverse direction. Each of the gate lines 121 includes a plurality of gate electrodes 124 projecting downward and an end portion 129 having a large area for contact with another layer or an external driving circuit.

The gate lines 121 are made of a metal having low resistivity such as molybdenum (Mo), a molybdenum alloy, chromium (Cr), a chromium alloy, aluminum (Al), an aluminum alloy, copper (Cu), a copper alloy, silver (Ag), and a silver alloy.

A gate insulating layer 140 is formed on the gate lines 121. The gate insulating layer 140 may be made of a photosensitive organic material or an inorganic material, and the thickness of the insulating layer 140 may be from about 5000 Å to about 4 microns.

A plurality of data lines 171, a plurality of drain electrodes 173p, and a plurality of source electrodes 173q are formed on the gate insulating layer 140.

The data lines 171 for transmitting data signals extend substantially in a longitudinal direction and intersect the gate lines 121. Each data line 171 includes a plurality of drain electrodes 173p protruding aside, and an end portion 179 having a large area for contact with another layer or an external driving circuit.

The data lines 171, the drain electrodes 173p, and the source electrodes 173q respectively include lower layers 173pa, 173qa, and 179a made of ITO (indium tin oxide) or IZO (indium zinc oxide), and upper layers 173pb, 173qb, 179b made of molybdenum (Mo) or a molybdenum alloy.

The drain electrodes 173p are connected to the data lines 171, and enclose the source electrodes 173q. In detail, the drain electrodes 173p are separated from at least one of the source electrodes 173q by a predetermined interval, and are formed on the circumference of the source electrodes 173q. The drain electrodes 173p may be variously shaped as a closed loop with no open portion, such as a ring, a polygon, and an oval. Further, the source electrodes 173q have an island shape and are disposed within the drain electrodes 173p.

Here, the space between the drain electrode 173p and the source electrode 173q is defined as a channel region C, the interval between the drain electrode 173p and the source electrode 173q is the length L of the channel region C, and the length of the facing inner sides between the source electrode 173q and the drain electrode 173p is the width W of the channel region C. The channel region C is enclosed by the drain electrode 173p, and may be variously shaped as a closed loop with no disconnected portion, such as a ring, a polygon, and an oval. Generally, the on-current of the organic thin film transistor is directly proportional to the value of the width W/the length L of the channel region C. In the organic thin film transistor according to the exemplary embodiment of the present invention, because the source electrode 173q is enclosed by the drain electrode 173p, the width W of the channel region C may be relatively increased in comparison with the conventional channel region of a straight line or a "J" type. Accordingly, a thin film transistor having improved characteristics of a high on-current may be obtained. Furthermore, according to the structure of the present invention, the overlapping area between the gate electrode 124 and the source electrode 173q is relatively small in comparison with the conventional structure. Accordingly, the parasitic capacitance generated between the gate electrode 124 and the source electrode 173q is reduced such that the characteristics of the thin film transistor may be improved.

A portion of the source electrode 173q contacts a pixel electrode 190, and each pixel electrode 190 receives data signals from a source electrode 173q. The pixel electrodes 190 generate an electric field in conjunction with a common electrode (not shown) of an opposing display panel (not shown) supplied with a common voltage, which determines the orientations of liquid crystal molecules (not shown) in a liquid crystal layer (not shown) disposed between the two electrodes, or induces a current for emitting of an emitting layer (not shown).

A bank insulating layer 160 is formed on the data lines 171, the drain electrodes 173p, and the source electrodes 173q. The bank insulating layer 160 is preferably made of a photosensitive organic material, and the thickness of the bank insulating layer 160 may be in the range of about 5000 angstroms to 4 microns.

The bank insulating layer 160 has a plurality of first openings 163.

The first openings 163 are disposed on the gate electrode 124, and expose portions of the drain electrodes 173*p* and the source electrodes 173*q*. The upper layers 173*pb* and 173*qb* of the drain electrode 173*p* and source electrode 173*q* are removed at the exposed drain electrode 173*p* and the source electrode 173*q* in the first openings 163, and the lower layers 173*pa* and 173*qa* of the drain electrode 173*p* and source electrode 173*q* are exposed.

A plurality of organic semiconductor islands 154 are formed in the first openings 163.

The organic semiconductor islands 154 contact the lower layers 173*pa* and 173*qa* of the drain electrodes 173*p* and source electrodes 173*q*, and overlap the gate electrodes 124. The contact resistance between the drain and source electrodes 173*p* and 173*q*, and the organic semiconductor islands 154, may be reduced by the contact of the organic semiconductor islands 154 and the lower layers 173*pa* and 173*qa* of the drain electrodes 173*p* and the source electrodes 173*q*.

The organic semiconductor islands 154 may include a high molecular compound or a low molecular compound that is soluble in an aqueous solution or an organic solvent.

The organic semiconductor islands 154 may be made of or from derivatives of tetracene or pentacene with a substituent. Alternatively, the organic semiconductor islands 154 may be made of an oligothiophene including four to eight thiophenes connected at the positions 2 and 5 of thiophene rings.

The organic semiconductor islands 154 may be made of polythienylenevinylene, poly 3-hexylthiophene, polythiophene, phthalocyanine, or metallized phthalocyanine, or halogenated derivatives thereof. Alternatively, the organic semiconductor islands 154 may be made of perylene tetracarboxylic dianhydride (PTCDA), naphthalene tetracarboxylic dianhydride (NTCDA), or their imide derivatives. The organic semiconductor islands 154 may also be made of perylene, coronene, or derivatives thereof with a substituent.

The thickness of the organic semiconductor islands 154 may be in the range of from about 300 angstroms to about 1 micron.

The bank insulating layer 160 defining the first openings 163 serves as a bank or partition against the organic semiconductor islands 154. As shown in FIG. 1, the bank insulating layer 160 covers the whole substrate 110 except for the portions corresponding to the first openings 163, the source electrodes 173*q*, and the end portions 129 and 179 of the gate lines 121 and the data lines 171.

A passivation layer 180 is formed on the bank insulating layer 160. The passivation layer 180 and the bank insulating layer 160 have a plurality of second openings 183 exposing the portions of the source electrodes 173*q*. Also, the passivation layer 180, the bank insulating layer 160, and the gate insulating layer 140 have a plurality of third openings 184 exposing the end portions 129 of the gate lines 121, and the passivation layer 180 and the bank insulating layer 160 have a plurality of fourth openings 185 exposing the end portions 179 of the data lines 171. A plurality of pixel electrodes 190, and a plurality of contact assistants 191 and 192 preferably made of a conductive material such as indium tin oxide (ITO) or indium zinc oxide (IZO), are formed on the passivation layer 180. The pixel electrodes 190 are connected to the source electrodes 173*q* through the second openings 183, and the contact assistants 191 and 192 are respectively connected to the end portions 129 and 179 of the gate lines 121 and the data lines 171 through the third and fourth openings 184 and 185.

A method of manufacturing the LCD shown in FIGS. 1 and 2 according to an embodiment of the present invention is described below in detail with reference to FIGS. 3 to 12.

Figure 3:
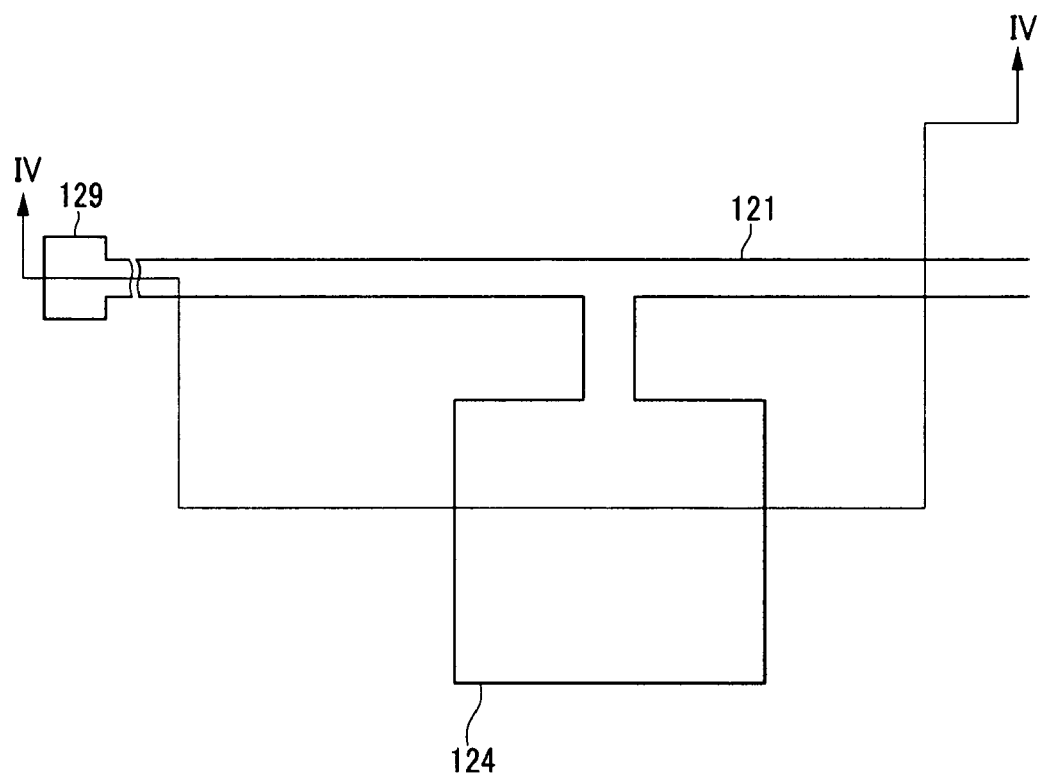
FIGS. 3, 6, 8, and 11 are layout views of the OTFT array panel shown in FIGS. 1 and 2 in intermediate steps of a manufacturing method thereof according to an embodiment of the present invention.
Figure 4:
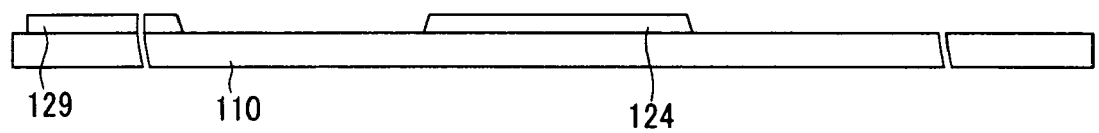
FIG. 4 is a cross-sectional view of the organic thin film transistor array panel shown in FIG. 3 taken along the line IV-IV.
Figure 5:
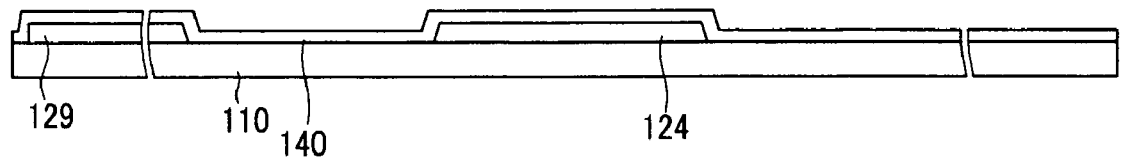
FIG. 5 is a cross-sectional view showing the subsequent manufacturing steps of the organic thin film transistor array panel shown in FIG. 4.
Figure 6:
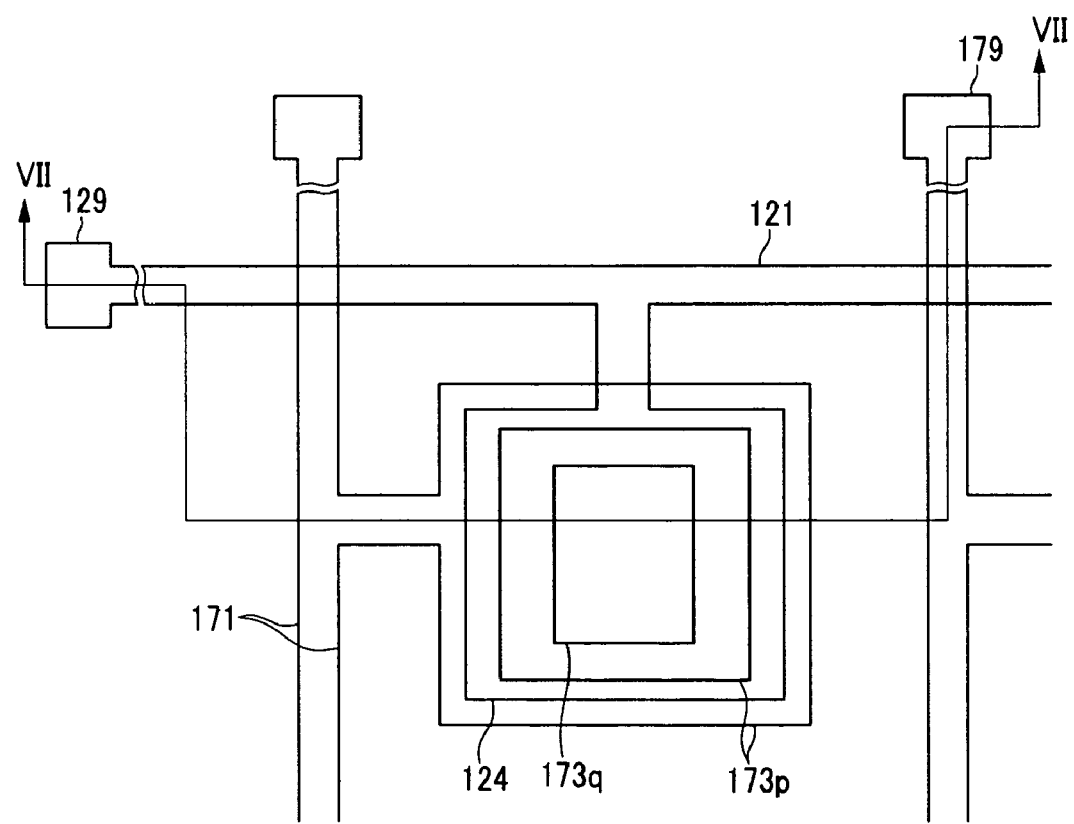
Figure 7:
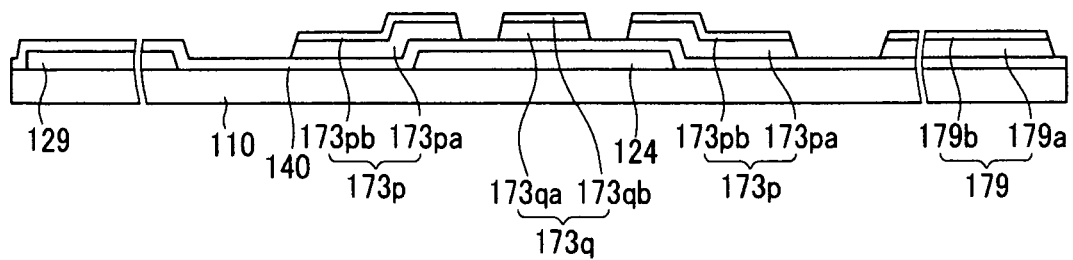
FIG. 7 is a cross-sectional view of the organic thin film transistor array panel shown in FIG. 6 taken along the line VII-VII.
Figure 8:
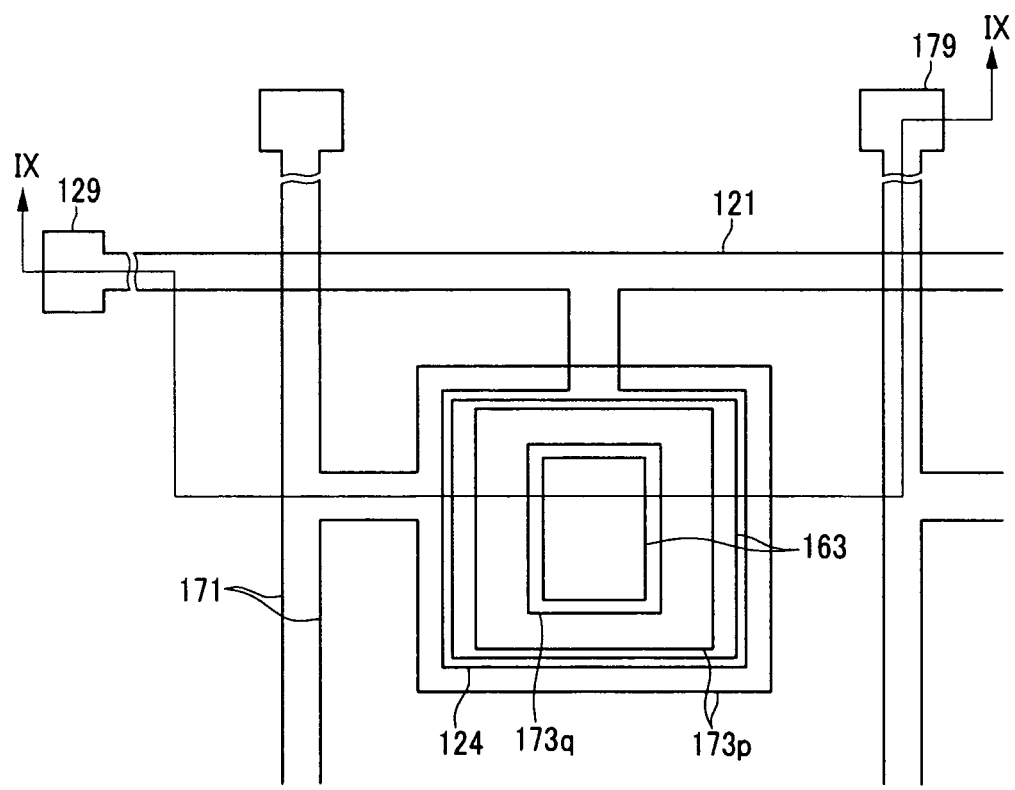
Figure 9:
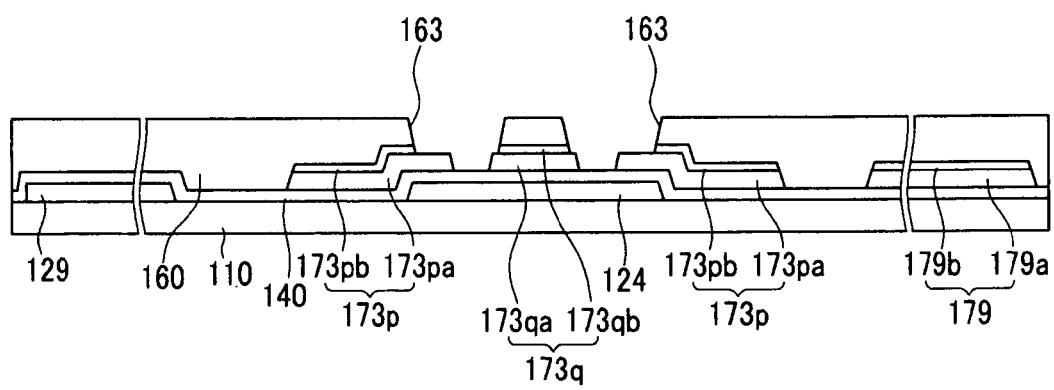
FIG. 9 is a cross-sectional view of the organic thin film transistor array panel shown in FIG. 8 taken along the line IX-IX.
Figure 10:
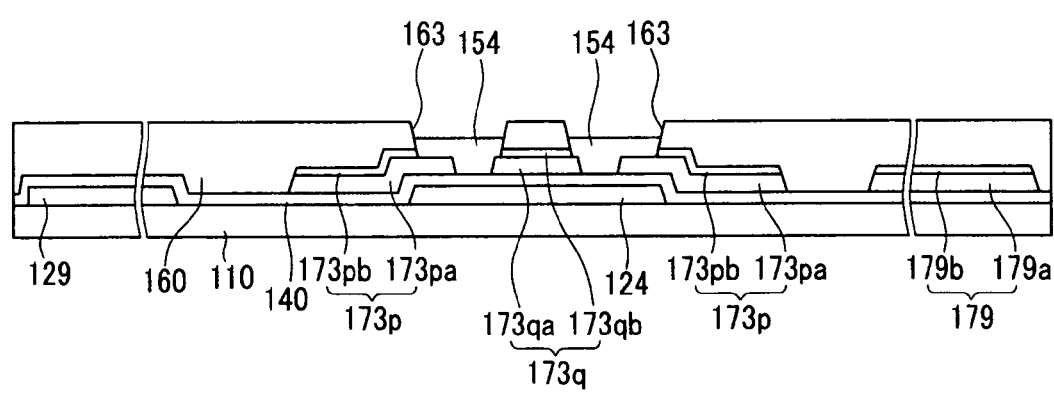
FIG. 10 is a cross-sectional view showing the subsequent manufacturing steps of the organic thin film transistor array panel shown in FIG. 9.
Figure 11:
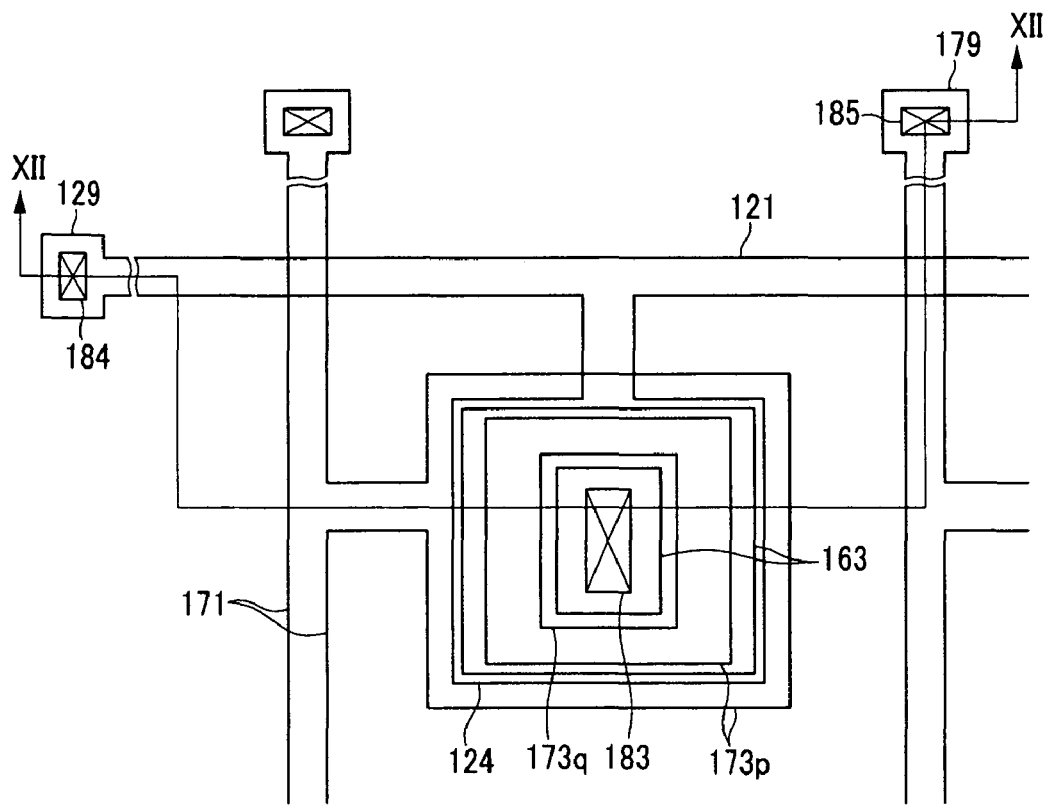
Figure 12:
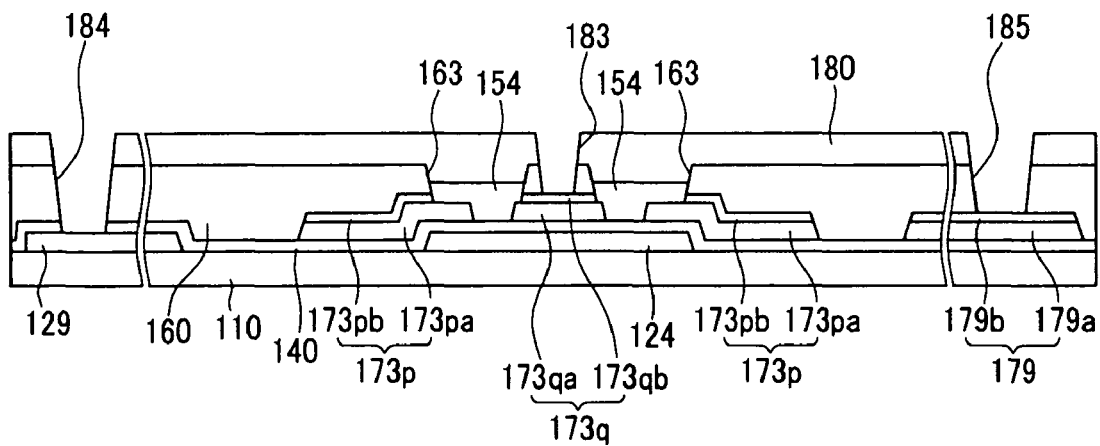
FIG. 12 is a cross-sectional view of the organic thin film transistor array panel shown in FIG. 11 taken along the line XII-XII.

FIGS. 3, 6, 8, and 11 are layout views of the OTFT array panel shown in FIGS. 1 and 2 in intermediate steps of a manufacturing method thereof according to an embodiment of the present invention, FIG. 4 is a cross-sectional view of the organic thin film transistor array panel shown in FIG. 3 taken along the line IV-IV, FIG. 5 is a cross-sectional view showing the following steps of the organic thin film transistor array panel shown in FIG. 4, FIG. 7 is a cross-sectional view of the organic thin film transistor array panel shown in FIG. 6 taken along the line VII-VII, FIG. 9 is a cross-sectional view of the organic thin film transistor array panel shown in FIG. 8 taken along the line IX-IX, FIG. 10 is a cross-sectional view showing the following steps of the organic thin film transistor array panel shown in FIG. 9, and FIG. 12 is a cross-sectional view of the organic thin film transistor array panel shown in FIG. 11 taken along the line XII-XII.

Referring to FIGS. 3 and 4, a conductive layer of a gate metal such as molybdenum is deposited on a substrate 110 by using sputtering, and is patterned by lithography and etched to form a plurality of gate lines 121 including a plurality of gate electrodes 124 and end portions 129.

Next, referring to FIG. 5, a gate insulating layer 140, preferably made of an insulating material is deposited on the substrate 110.

Next, referring to FIGS. 6 and 7, a lower layer made of ITO and an upper layer including Mo are sequentially deposited on the substrate 110 by using sputtering, and are sequentially patterned by photolithography and etching to form a plurality of data lines 171 including a plurality of drain electrodes 173*p* and a plurality of end portions 179, and a plurality of source electrodes 173*q*, which are made of lower layers 173*pa*, 173*qa*, and 179*a* and upper layers 173*pb*, 173*qb*, and 179*b*. Here, the etching may be executed by wet-etching using an ITO etchant.

Subsequently, as shown in FIGS. 8 and 9, an organic photosensitive layer is coated on the entire substrate 110 and developed to form a bank interlayer insulating layer 160 having a plurality of first openings 163 exposing portions of the source and drain electrodes 173*p* and 173*p*. Here, the portions of the interlayer insulating layer 160 disposed on the end portions 129 and 179 of the gate lines 121 and the data lines 171 are removed. Next, the upper layers 173*pb* and 173*qb* of the source electrode 173*q* and the drain electrode 173*p* exposed through the first openings 163 are removed to expose the lower layers 173*pa* and 173*qa* of the source electrode 173*q* and the drain electrode 173*p*.

Next, referring to FIG. 10, a plurality of organic semiconductor islands 154 are formed in the first openings 163. An inkjet printing method may be used to form the organic semiconductor islands 154, and the steps for spraying an organic semiconductor solution in the first openings 163 on the substrate 110 while moving an inkjet head (not shown) and drying the organic semiconductor solution are needed.

Here, the organic semiconductor solution is filled in the first openings 163 by using the bank insulating layer 160 as a bank.

Next, referring to FIGS. 11 and 12, a passivation layer 180 is deposited, and is patterned by photolithography along with the bank insulating layer 160 and the gate insulating layer 140 to form a plurality of second to fourth openings 183, 184, and 185. The passivation layer 180 may be made of a photosensitive film or a non-photosensitive film. When forming the passivation layer 180 made of a photosensitive material, the passivation layer 180 is completed by an exposure step and a developing step, and when forming the passivation layer 180 made of a non-photosensitive material, an additional photolithography process is necessary to complete the passivation layer 180.

Finally, referring to FIGS. 1 and 2, an ITO layer or an IZO layer is deposited on the passivation layer 180 and patterned to form a plurality of pixel electrodes 190 and a plurality of contact assistants 191 and 192. Here, the pixel electrodes 190 are contacted with the source electrodes 173q through the second openings 183.

An organic thin film transistor array panel according to another embodiment of the present invention will be described in detail with reference to FIG. 13.

Figure 13:
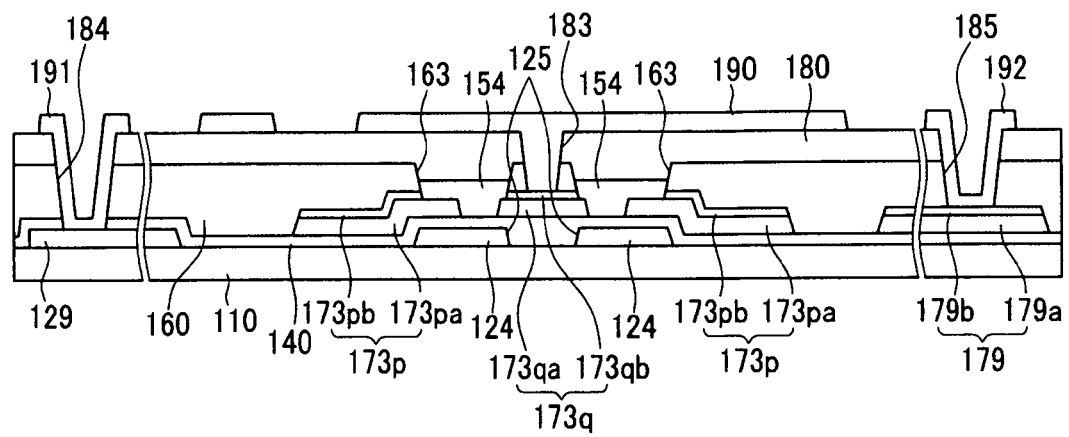
FIG. 13 is a cross-sectional view of an organic thin film transistor array panel according to a second exemplary embodiment of the present invention.

FIG. 13 is a cross-sectional view of an organic thin film transistor array panel according to a second exemplary embodiment of the present invention.

The organic thin film transistor array panel of the second exemplary embodiment has almost the same structure as that of the first exemplary embodiment. However, the gate electrodes 124 include a plurality of gate electrode holes 125.

The gate electrode holes 125 overlap the second openings 183 of the bank insulating layer 160 and the passivation layer 180.

Because the parasitic capacitance of the organic thin film transistor is increased in proportion to the overlapping area between the gate electrode 124 and the source electrode 173q, the gate electrodes 124 having the gate electrode holes 125 may have the effect of preventing the increase of the parasitic capacitance of the organic thin film transistor.

An organic thin film transistor array panel according to a third exemplary embodiment of the present invention is described below in detail with reference to FIGS. 14 and 15.

Figure 14:
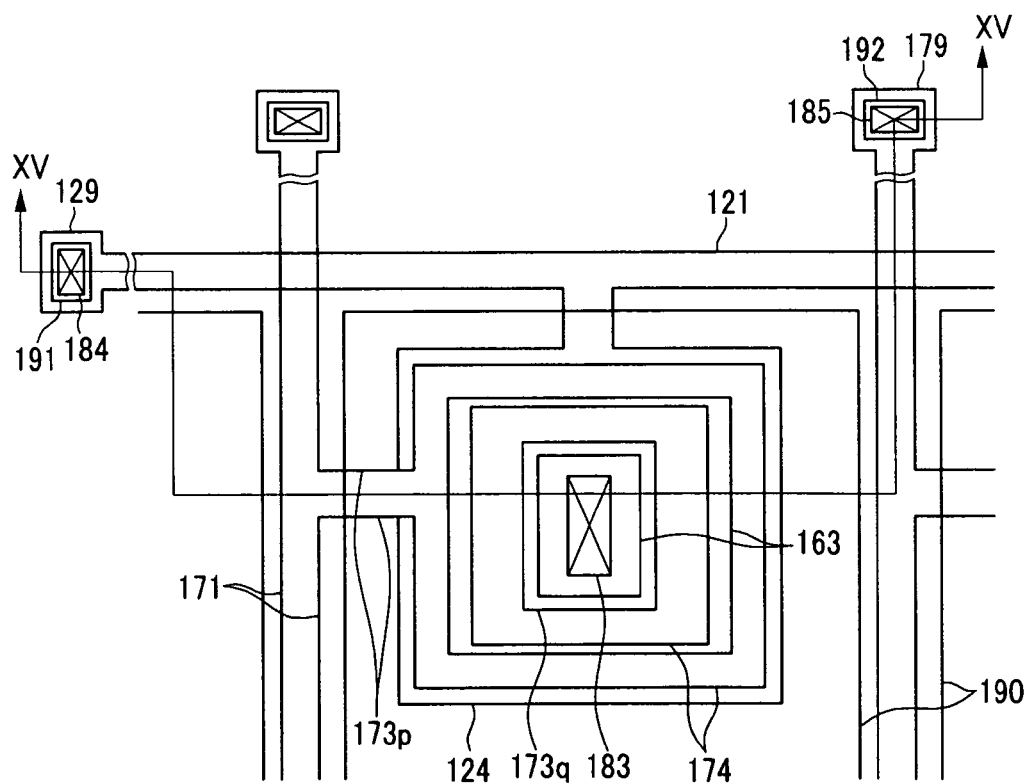
FIG. 14 is a layout view of an organic thin film transistor array panel according to a third exemplary embodiment of the present invention.
Figure 15:
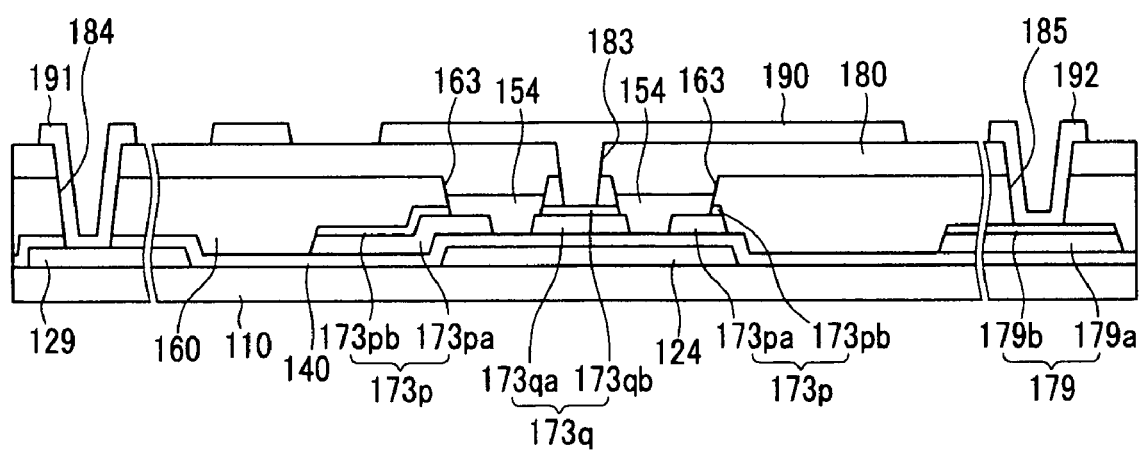
FIG. 15 is a cross-sectional view of the organic thin film transistor array panel shown in FIG. 14 taken along the line XV-XV.

FIG. 14 is a layout view of an organic thin film transistor array panel according to a third exemplary embodiment of the present invention, and FIG. 15 is a cross-sectional view of the organic thin film transistor array panel shown in FIG. 14 taken along line XV-XV.

The organic thin film transistor array panel according to the third exemplary embodiment of the present invention includes drain electrodes 173p having the whole portion 174, which is formed of the closed loop, disposed on the gate electrodes 124, differently from the first exemplary embodiment. By disposing the whole portion 174 forming the closed loop among the drain electrodes 173p on the gate electrodes 124, the current generated according to the closed loop of the drain electrode 173p may be prevented, thereby improving the characteristics of the organic thin film transistor.

The manufacturing methods of the organic thin film transistor array panels according to the second exemplary embodiment and the third exemplary embodiment are the same as that of the first exemplary embodiment. Only the structure of the gate electrodes 124 is changed in the second exemplary embodiment, and only the structure of the drain electrodes 173p is changed in the third exemplary embodiment.

As described above, in the organic thin film transistor array panel according to the exemplary embodiments of the present invention, the increase of the parasitic capacitance that is generated between the source electrode and the gate electrode may be prevented and the value of W/L of the channel region may be maximized, thereby improving the characteristics of the thin film transistor.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic thin film transistor array panel comprising:
    a substrate;
    a gate line formed on the substrate and including a gate electrode;
    a gate insulating layer formed on the gate electrode;
    a data line formed on the gate insulating layer, intersecting the gate line, and including a drain electrode;
    a source electrode spaced apart from the drain electrode and enclosed by the drain electrode;
    a bank insulating layer having a first opening exposing at least a portion of the drain electrode and the source electrode, and a second opening exposing at least a portion of the source electrode;
    an organic semiconductor formed in the first opening, the organic semiconductor contacting at least a portion of the drain electrode and the source electrode; and
    a pixel electrode having a portion contacting the source electrode through the second opening, wherein the second opening is enclosed by the first opening.

2. The organic thin film transistor array panel of claim 1, wherein the gate electrode includes a gate electrode hole.

3. The organic thin film transistor array panel of claim 2, wherein the gate electrode hole overlaps the second opening of the bank insulating layer.

4. The organic thin film transistor array panel of claim 1, wherein the drain electrode comprises a closed loop portion.

5. The organic thin film transistor array panel of claim 4, wherein the closed loop portion overlaps at least a portion of the gate electrode.

6. The organic thin film transistor array panel of claim 4, wherein the closed loop portion overlaps the entire gate electrode.

7. The organic thin film transistor array panel of claim 1, further comprising a passivation layer formed on the organic semiconductor.

8. The organic thin film transistor array panel of claim 7, wherein
    the drain electrode, the source electrode, and the pixel electrode comprise one of ITO (indium tin oxide) and IZO (indium zinc oxide).

9. The organic thin film transistor array panel of claim 8, wherein the organic semiconductor comprises substituents of tetracene or pentacene.

10. The organic thin film transistor array panel of claim 1, wherein the data line and the source electrode are comprised of a first layer including ITO and a second layer including molybdenum, and the organic semiconductor contacts the first layer of the source electrode and the drain electrode.

11. The organic thin film transistor array panel of claim 1, wherein the pixel electrode overlies the entire organic semiconductor.

12. The organic thin film transistor array panel of claim 11, wherein
    the organic semiconductor laterally surrounds the source electrode and contacts the source and drain electrodes on all sides of the source electrode.

13. The organic thin film transistor array panel of claim 1, wherein the second opening substantially underlies a center portion of the pixel electrode.

14. The organic The thin film transistor array panel of claim 1, wherein the organic semiconductor is formed on at least two opposite sides of the source electrode and the pixel electrode has a portion crossing over the organic semiconductor on at least two opposite sides of the source electrode.

* * * * *